US006855610B2

(12) United States Patent
Tung et al.

(10) Patent No.: US 6,855,610 B2
(45) Date of Patent: Feb. 15, 2005

(54) METHOD OF FORMING SELF-ALIGNED CONTACT STRUCTURE WITH LOCALLY ETCHED GATE CONDUCTIVE LAYER

(75) Inventors: Ming-Sheng Tung, HuaLien (TW); Yueh-Chuan Lee, ChungHsing Tsuen (TW)

(73) Assignee: Promos Technologies, Inc., Hsinchu (TW)

( * ) Notice: Subject to any disclaimer, the term of this patent is extended or adjusted under 35 U.S.C. 154(b) by 106 days.

(21) Appl. No.: 10/330,522

(22) Filed: Dec. 27, 2002

(65) Prior Publication Data

US 2004/0051183 A1 Mar. 18, 2004

(30) Foreign Application Priority Data

Sep. 18, 2002 (TW) ........................................ 91121343 A

(51) Int. Cl.$^7$ ............................................. H01L 21/336
(52) U.S. Cl. ....................................... 438/299; 438/303
(58) Field of Search ............................... 438/157, 230, 438/229, 303, 299, 696, 720, 72, 686

(56) References Cited

U.S. PATENT DOCUMENTS

| | | | |
|---|---|---|---|
| 5,989,987 A | | 11/1999 | Kuo |
| 6,613,684 B2 | * | 9/2003 | Fujimoto ..................... 438/706 |
| 6,633,059 B1 | * | 10/2003 | Hirade ........................ 257/288 |
| 6,762,110 B1 | * | 7/2004 | Masuda ....................... 438/396 |
| 2004/0147084 A1 | * | 7/2004 | Inoue et al. ................. 438/381 |

OTHER PUBLICATIONS

Yamamoto, K., et al., "Control of Cleaning Performance of an Ammonia and Hydrogen Peroxide Mixture (APM) on the Basis of a Kinetic Reaction Model," *IEEE Transactions on Semiconductor Manufacturing* 12(3):288–294, Aug. 1999.

* cited by examiner

Primary Examiner—S. V. Clark
(74) Attorney, Agent, or Firm—Christensen O'Connor Johnson Kindness PLLC

(57) ABSTRACT

A method of forming a self-aligned contact structure with a locally etched conductive layer comprises the steps of: preparing a substrate formed with gate structures comprising a first conductive layer, a second conductive layer, and an insulating layer; depositing a photoresist material layer on the substrate; performing a lithographic step with a bit-line contact node photomask or a bit-line contact photomask to expose a portion of the surface of the substrate; etching the exposed second conductive layer with an etchant; removing the remaining photoresist material layer; forming a sidewall spacer on the sidewalls of each gate structure; forming a dielectric layer to cover the substrate; and performing lithographic and etching steps to remove the dielectric layer and to form self-aligned contact structure.

29 Claims, 10 Drawing Sheets

METHOD OF FORMING SELF-ALIGNED CONTACT STRUCTURE WITH LOCALLY ETCHED GATE CONDUCTIVE LAYER

FIELD OF THE INVENTION

The present invention relates to a method of forming a self-aligned contact structure and, in particular, the present invention relates to a method of eliminating the disadvantage of the short circuit problem of a gate conductor/bit-line contact (GC/CB) formed in prior manufacturing processes and increasing a larger process window.

BACKGROUND OF THE INVENTION

Normally, a metal oxide semiconductor (MOS) device is composed of a metal layer, a silicon oxide layer, and a substrate. Since the adhesion between the metal and the oxide is poor, a polysilicon material is often used to replace the metal so as to form the conductive layer of an MOS device. However, the disadvantage of the polysilicon material is that its resistance is higher than that of the metal. Although the resistance can be reduced by doping impurities, the generated conductivity is not high enough for a good conductive layer of an MOS device. A general solution is to add a metal silicide layer on the polysilicon layer, such as a tungsten silicide (WSi) layer, so as to improve the conductivity of the gate structure.

In prior art, a method of forming a contact structure comprises the following steps: forming a dielectric layer; forming a contact; and forming a metal layer. The general method for forming a metal contact between the metal layer and the substrate is the self-aligned contact etching method.

FIGS. 1A–1C represent a conventional method of forming a gate structure. The method is described as follows.

Referring to FIG. 1A, first, a substrate 2 is prepared. Next, a plurality of separated gate structures is formed on the substrate 2, wherein each gate structure comprises a first conductive layer 4, a second conductive layer 6, an insulating layer 8, and two sidewall spacers 10. A dielectric layer 12 is formed to cover the whole substrate after the gate structure is formed.

Referring to FIG. 1B, next a lithographic process and an etching process are performed to remove a selected portion of the dielectric layer 12 until the top surface of the substrate is exposed. The etching process also affects the insulating layer 8 and the sidewall spacer 10. Since the etching rate of the insulating layer 8 and the sidewall spacer 10 is lower than that of the dielectric layer 12, only portions of the insulating layer 8 and the sidewall spacer 10 are removed. As a result, a contact 20, which is formed between the gate structures, can be self-aligned to the substrate where a contact region is formed. As shown in the same figure, the contact region is formed on an exposed top surface of the substrate 2 with a width of X.

Referring now to FIG. 1C, a metal layer 14 is deposited to a specific thickness so as to cover the exposed surface of the substrate, the sidewall spacers 10 of the gate structures, and the substrate 2. In this way, a metal contact of the width of X is formed in the self-aligned contact 20 between the metal layer 14 and the substrate 2.

The contact resistance of the aforementioned self-aligned contact is proportional to the contact region (i.e., the region marked with the width X) between the metal layer 14 and the substrate 2. The contact region can be increased during the etching process by extending the etching time. However, if the etching time is not controlled properly, the method will overly etch the insulating layer 8 and the sidewall spacer 10 such that the second conductive layer 6 is exposed. The exposed part of the second conductive layer 6 will contact the metal layer 14 at point 16 and cause a short circuit.

In order to improve the above-mentioned conventional manufacturing process, U.S. Pat. No. 5,989,987 provides an improved method of forming a self-aligned contact structure, as shown FIGS. 2A–2D. The prior art method is described as follows.

Referring to FIG. 2A, first a substrate 2 is prepared. The substrate has a first conductive layer 4, a second conductive layer 6, and an insulating layer 8 formed in sequence from bottom to top. The first conductive layer 4 can be a polysilicon layer or an amorphous silicon layer. Next, a plurality of separated gate structures is formed by performing a dry etching step to the extent that the top surface of the substrate 2 is exposed.

Referring next to FIG. 2B, the second conductive layer 6 is etched with an etchant, which is a mixture of $NH_4OH$, $H_2O_2$, and $H_2O$. Although the purpose of the etchant is to etch the second conductive layer 6, the first conductive layer 4 is also etched at a slower etching rate. A sidewall spacer layer 10 is formed on each side of each gate structure after the etching step is finished.

Referring to FIG. 2C, a dielectric layer 12 is formed on the whole top surface of the substrate to cover all the gate structures and the exposed surface of the substrate. After that, selected portions of the dielectric layer 12 between the gate structures are removed until the top surface of the substrate 2 is exposed.

Referring then to FIG. 2D, a metal layer 14 of a specific thickness is deposited to cover the exposed surface of the dielectric layer 12, the sidewall spacers 10 of the gate structures, and the substrate 2. In this way, a metal contact is formed in a self-aligned contact 20 between the metal layer 14 and the substrate 2.

The advantage of the method of the aforementioned U.S. Pat. No. 5,989,987 resides in the extra etching step, which is performed on the second conductive layer 6. The width of the second conductive layer 6 is narrower than that of the above insulating layer 8 due to this extra etching process, so as to form a larger process window and to avoid a short circuit caused by the contact of the second conductive layer 6 and the metal layer 14 at point 16.

However, the method of forming a self-aligned contact structure provided by U.S. Pat. No. 5,989,987 has the following disadvantages:

(1) The etching step of the second conductive layer 6 is global. In other words, one side of the second conductive layer 6, which is not used to form bit-line contact, is also etched. Since the cross-section area of the second conductive layer 6 is reduced, the resistance of the gate conductor is increased accordingly.

(2) The etching step reduces the contact area between the second conductive layer 6 and the first conductive layer 4. The peeling phenomenon will be induced in subsequent manufacturing processes if too much contact area is reduced.

SUMMARY OF THE INVENTION

The main object of the present invention is to provide methods of forming a self-aligned contact structure with a locally etched second conductive layer. The self-aligned contact structure formed by said methods can have a larger process window, larger cross-section area, lower resistance, and can avoid the peeling phenomenon between the second conductive layer and the first conductive layer. The method according to a first embodiment of the present invention comprises the following steps:

(1) depositing a first conductive layer on the entire top surface of a substrate;

(2) depositing a second conductive layer on the entire top surface of the first conductive layer;

(3) depositing an insulating layer on the entire top surface of the second conductive layer;

(4) performing a lithographic process and an etching process to form plurality of gate structures;

(5) depositing a photoresist material layer on the entire top surface of the substrate, or depositing a photoresist layer after depositing an anti-reflective coating (ARC);

(6) performing a lithographic process, or a lithographic process and an etching process, with a bit-line contact node photomask to remove the photoresist material layer or the photoresist material layer and the anti-reflective coating on one side of each gate structure used to form bit-line contacts to form at least an opening to expose the top surface of the substrate;

(7) using an etchant that has a higher etching rate to the second conductive layer than to the insulating layer and the first conductive layer to etch the second conductive layer at the side of gate structures used to form bit-line contacts;

(8) removing the photoresist material layer or the photoresist layer and the anti-reflective coating;

(9) forming a sidewall spacer at each side of each gate structure;

(10) forming a dielectric layer, which covers the entire top surface of the substrate;

(11) forming a self-aligned contact by performing a lithographic process and an etching process to remove the dielectric layer on the side of each gate structure used to from a bit-line contact so as to expose the top surface of the substrate and to form a self-aligned contact; and

(12) forming a metal layer that covers the exposed surface of the dielectric layer and the sidewalls of the gate structures and forming a self-aligned contact on the exposed top surface of the substrate between the metal layer and the substrate.

The method according to a second embodiment of the present invention comprises the following steps:

(1) depositing a first conductive layer on the entire top surface of a substrate;

(2) depositing a second conductive layer on the entire top surface of the first conductive layer;

(3) depositing an insulating layer on the entire top surface of the second conductive layer;

(4) performing a lithographic process, or a lithographic process and an etching process, to form a plurality of gate structures;

(5) depositing a photoresist material layer on the entire top surface of the substrate, or depositing a photoresist layer after depositing an anti-reflective coating (ARC);

(6) performing a lithographic process and an etching process with a bit-line contact photomask to form at least a round opening between the gate structures so as to expose to the top surface of the substrate;

(7) using an etchant that has a higher etching rate to the second conductive layer than to the insulating layer and the first conductive layer to etch the second conductive layer at the side of gate structures used to form bit-line contacts;

(8) removing the photoresist layer or the photoresist layer and the anti-reflective coating;

(9) forming a sidewall spacer at each side of each gate structure;

(10) forming a dielectric layer that covers the entire top surface of the substrate;

(11) forming a self-aligned contact by performing a lithographic process and an etching process to remove the dielectric layer at the side of each gate structure used to form a bit-line contact so as to expose the top surface of the substrate and to form a self-aligned contact; and

(12) forming a metal layer that covers the exposed surface of the dielectric layer and the sidewalls of the gate structures and forming a self-aligned contact on the exposed top surface of the substrate between the metal layer and the substrate.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1A:
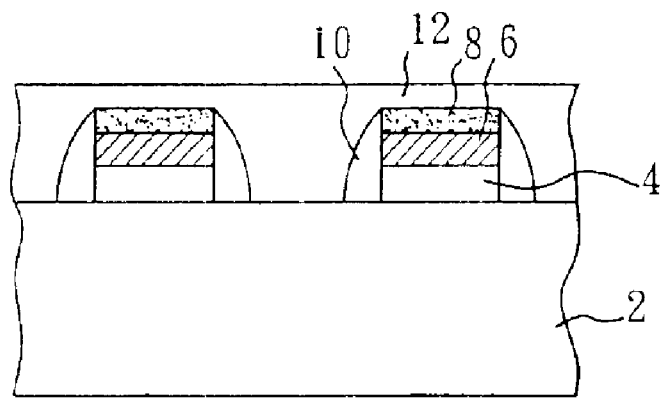
FIGS. 1A–1C represent a conventional method of forming a self-aligned contact structure.
Figure 1B:
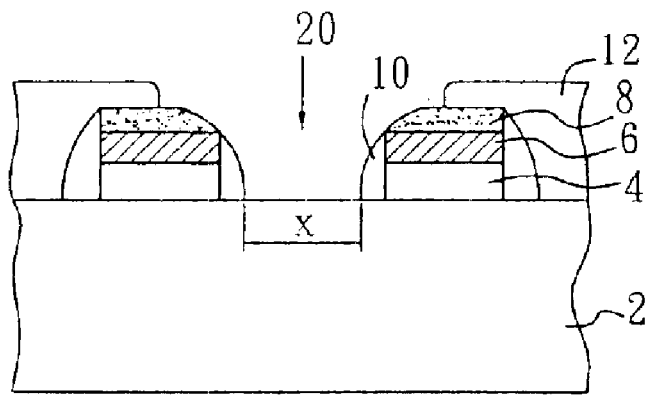
Figure 1C:
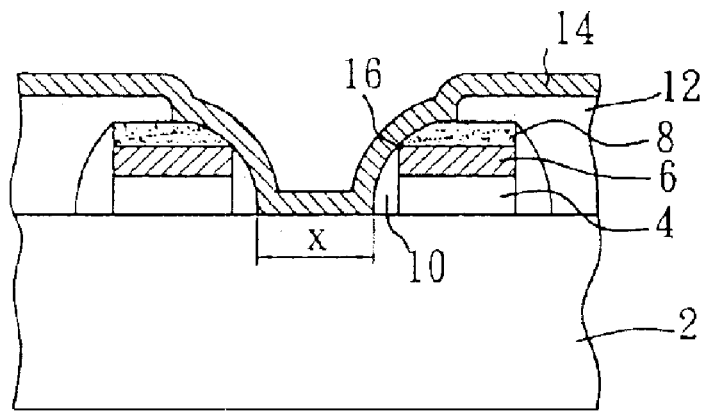
Figure 2A:
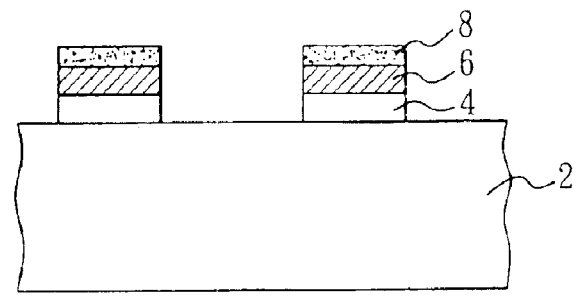
FIGS. 2A–2D represent a method of forming a self-aligned contact structure of U.S. Pat. No. 5,989,987.
Figure 2B:
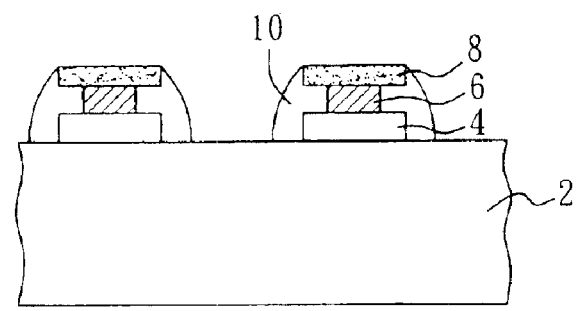
Figure 2C:
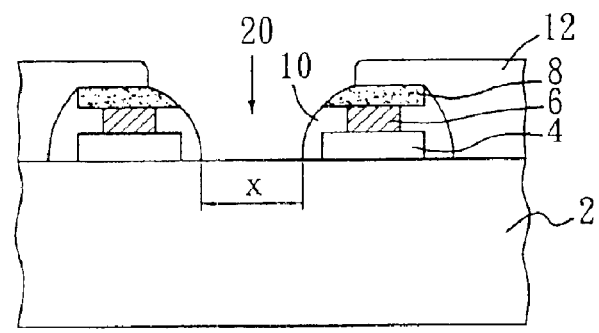
Figure 2D:
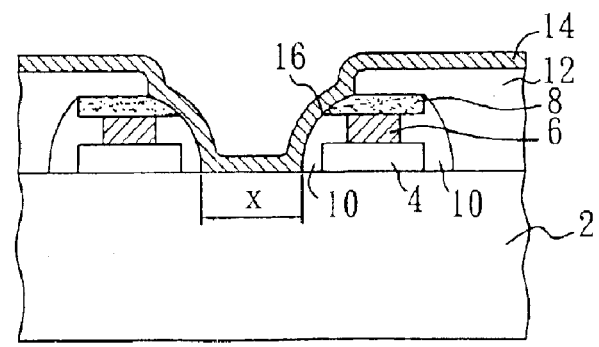

The preferred embodiment of the present invention will be described below with reference to the accompanying drawings. The same element in the drawings is represented with the same reference numeral.

Figure 3A:
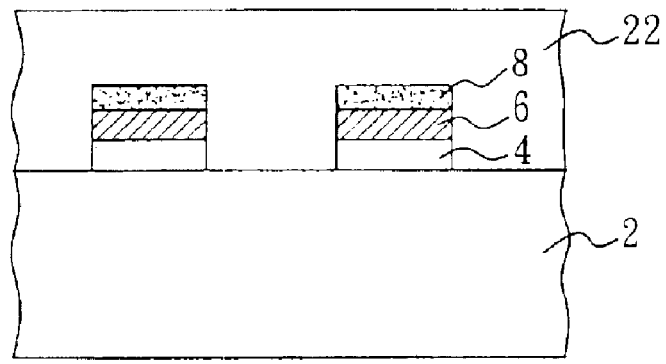
FIGS. 3A–3F represent the structures obtained after each step of the method according to the first embodiment of the present invention.
Figure 3B:
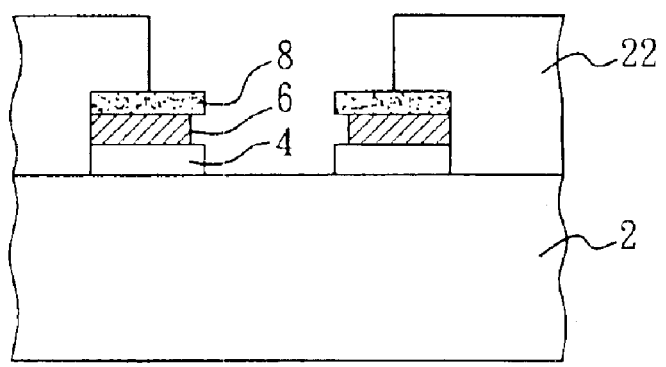
Figure 3C:
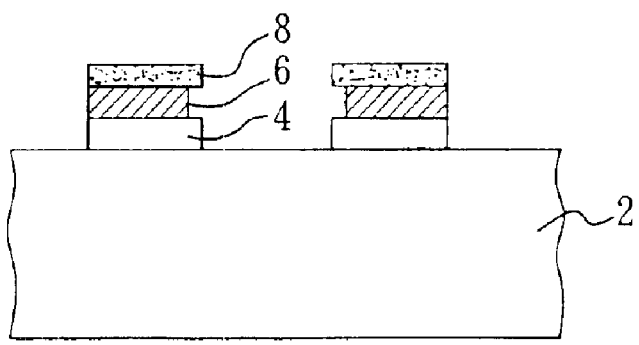
Figure 3D:
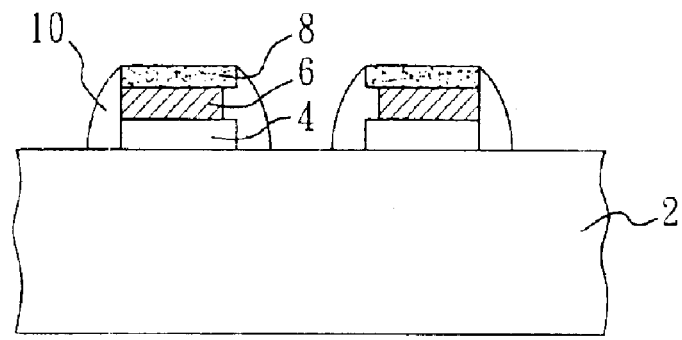
Figure 3E:
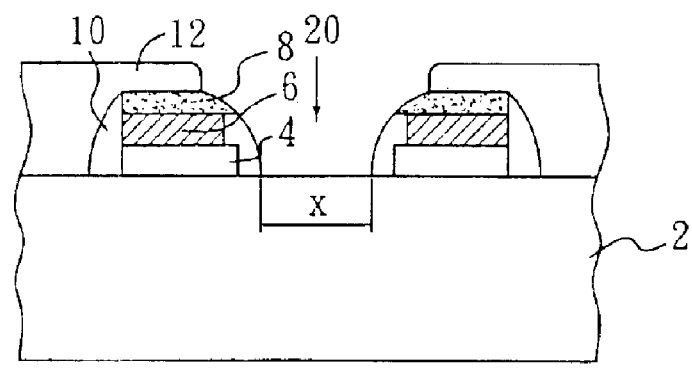
Figure 3F:
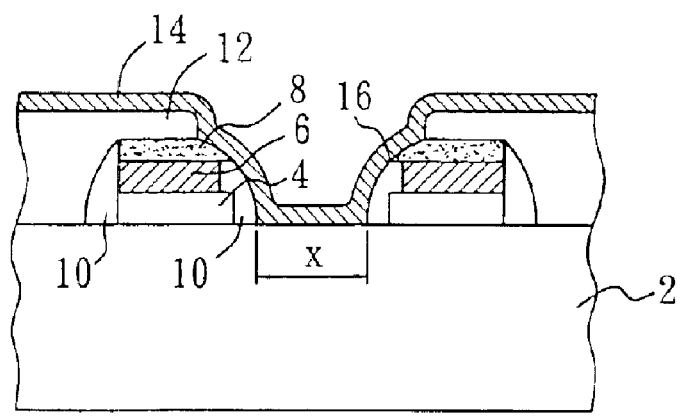
Figure 4A:
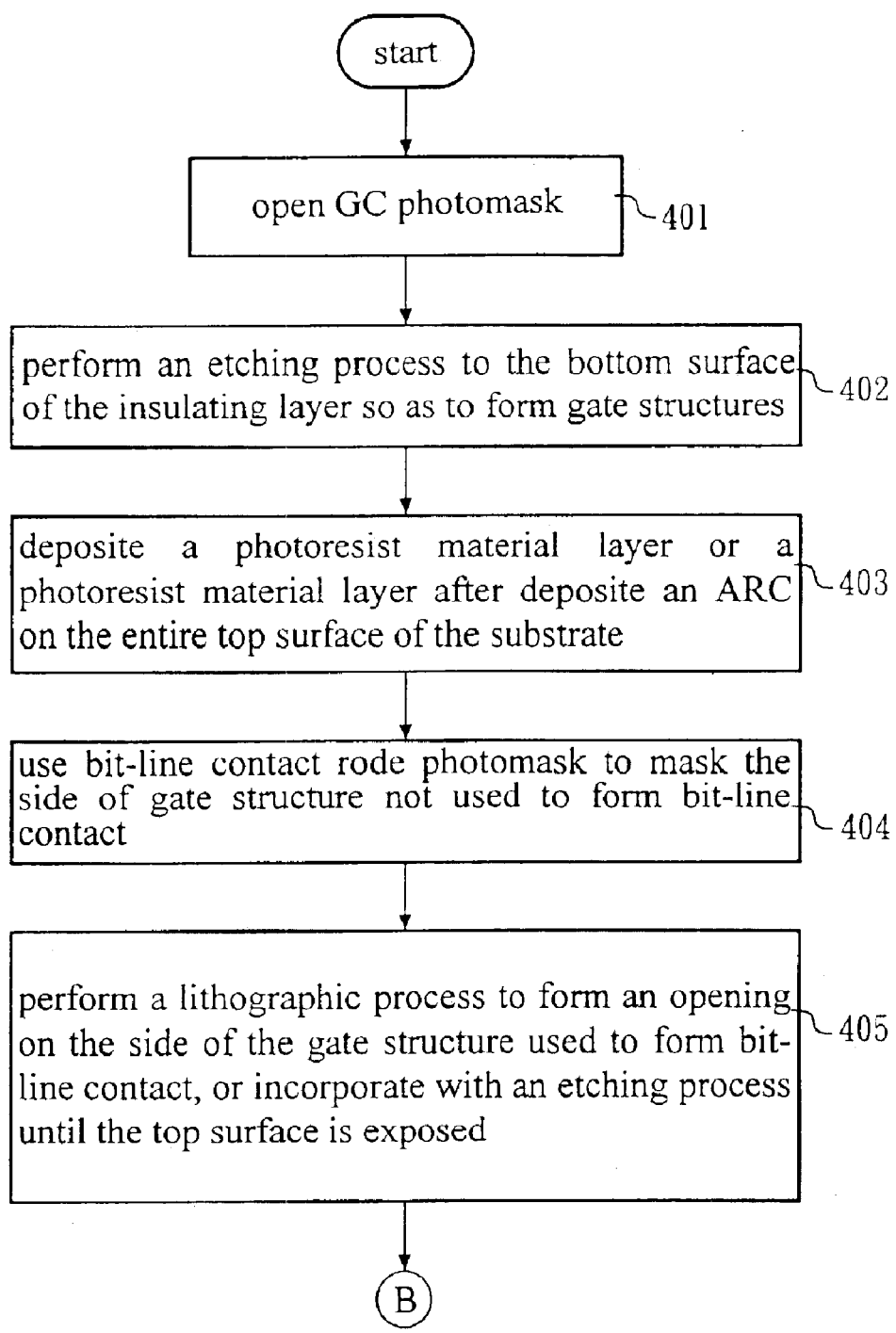
FIGS. 4A–4B represent a flow chart of the method of forming a self-aligned contact structure according to the first embodiment of the present invention.
Figure 4B:
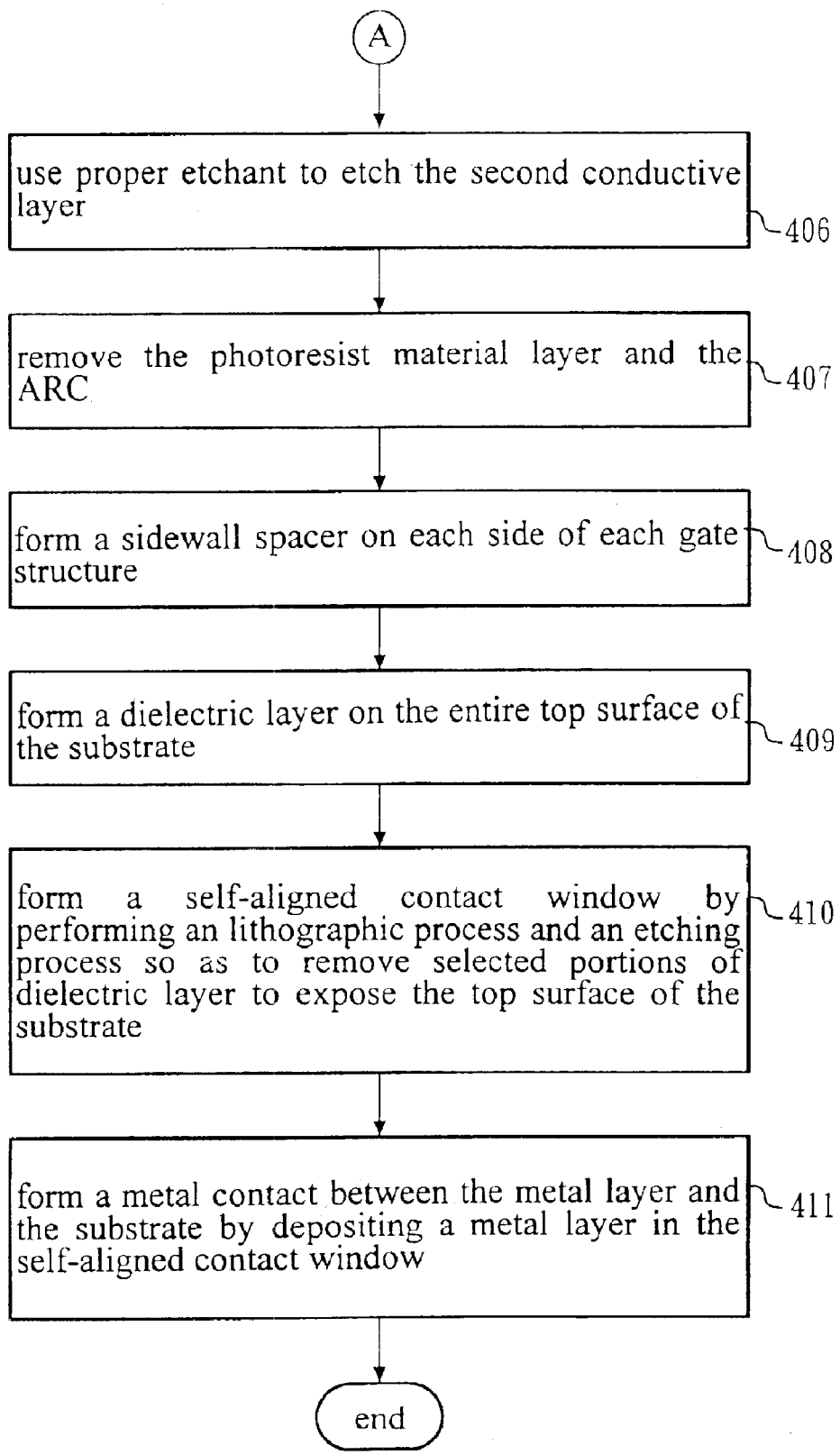

The first embodiment of the present invention is described by the structures from FIGS. 3A–3F and the method shown in the flow chart of FIGS. 4A–4B.

First, a substrate 2, which has a first conductive layer 4, a second conductive layer 6, and an insulating layer 8 formed in sequence from bottom to top, is prepared. The first conductive layer 4 can be a polysilicon layer or an amorphous silicon layer. The second conductive layer 6 can be a metal silicide layer, such as a tungsten silicide (WSi) layer, and the insulating layer 8 can be a silicon nitride layer. Next, as shown in FIG. 4A, a gate conductor (GC) photomask is opened (step 401). Next, a plurality of separated gate structures is formed by performing an etching process to the top surface of the substrate 2 (step 402).

Next, as shown in FIGS. 3A–4A, a photoresist material layer 22 is deposited, or an anti-reflective coating (ARC, not shown in the figures), and a photoresist material layer 22 are in turn deposited on the entire surface of the substrate 2 (step 403).

Next, as shown in FIGS. 3B, 4A–4B, a bit-line contact node photomask is used to mask the side of each gate structure that is not used to form a bit-line contacts (step 404). Next, a lithographic process is performed, or a lithographic process and an etching process are performed, in turn, to form an opening on the side of the gate structures used to form the bit-line contacts until the top surface of the substrate 2 is exposed (step 405), wherein the etching process can be a dry etching process. Next, an etchant that has a higher etching rate to the second conductive 6 layer than to the insulating layer 8 and the first conductive layer 4 is used to etch the side that is not covered by the photoresist material layer 22 (step 46), wherein the etching step can be an isotropic etching step (such as a mixture of $NH_4OH$, $H_2O_2$, and $H_2O$).

Next, as shown in FIGS. 3C and 4B, the photoresist material 22 and the anti-reflective coating (if there is any) are removed (step 407).

Next, as shown in FIGS. 3D and 4B, a sidewall spacer 10 is formed on each side of each gate structure (step 408). The sidewall spacer 10 can be a silicon nitride layer.

Next, as shown in FIGS. 3E and 4B, a dielectric layer 12 is deposited on the entire top surface of the substrate (step 409). Next, a lithographic process and an etching process are performed to remove a portion of the dielectric layer 12 on the side of the gate structure used to form the bit-line contact to expose the top surface of the substrate and to form a self-aligned contact (step 410).

Next, as shown in FIGS. 3F and 4B, a metal layer 14 of a specific thickness is deposited on the entire top surface of the substrate 2 so as to cover the exposed surface of the dielectric 12, sidewall spacers 10 of the self-aligned contact, and the substrate 2. In this way, a metal contact of a width of X is formed in a self-aligned contact 20 between the metal layer 14 and the substrate 2 (step 411).

Figure 5A:
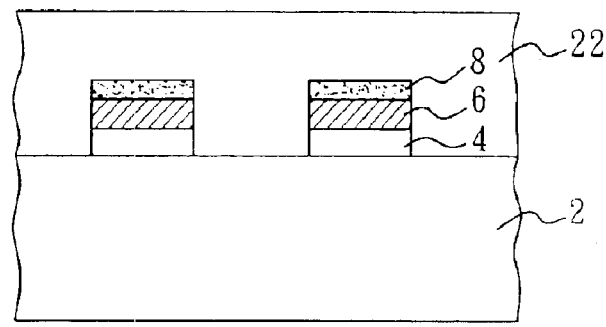
FIGS. 5A–5F represent the structures obtained after each step of the method according to the second embodiment of the present invention.
Figure 5B:
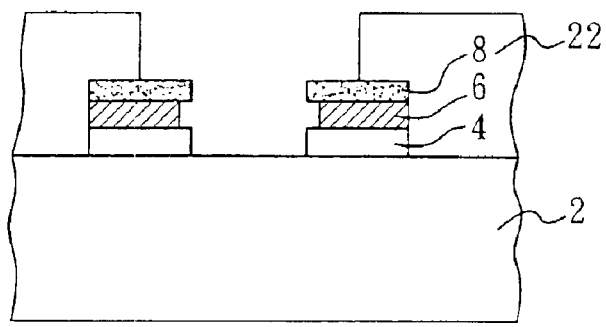
Figure 5C:
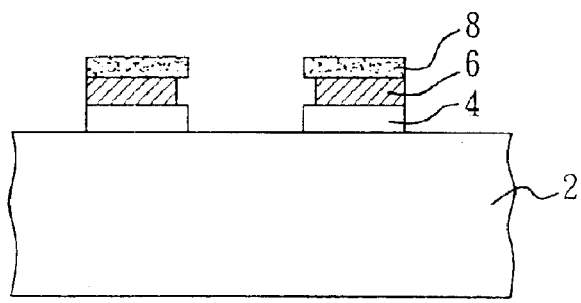
Figure 5D:
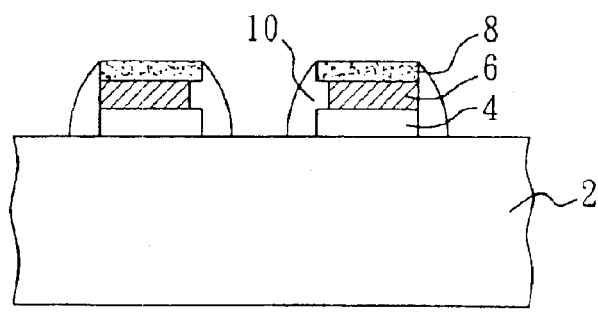
Figure 5E:
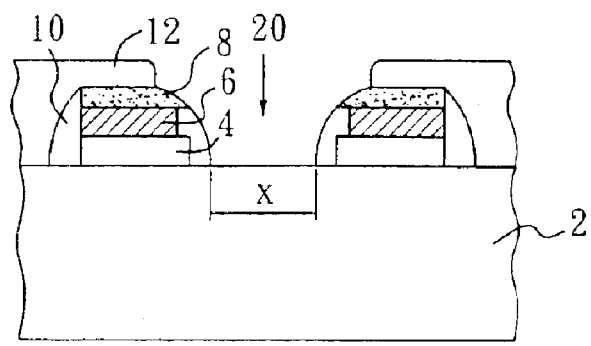
Figure 5F:
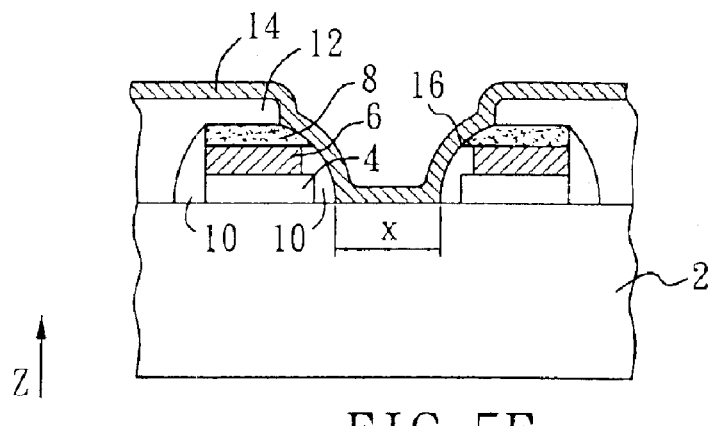
Figure 6A:
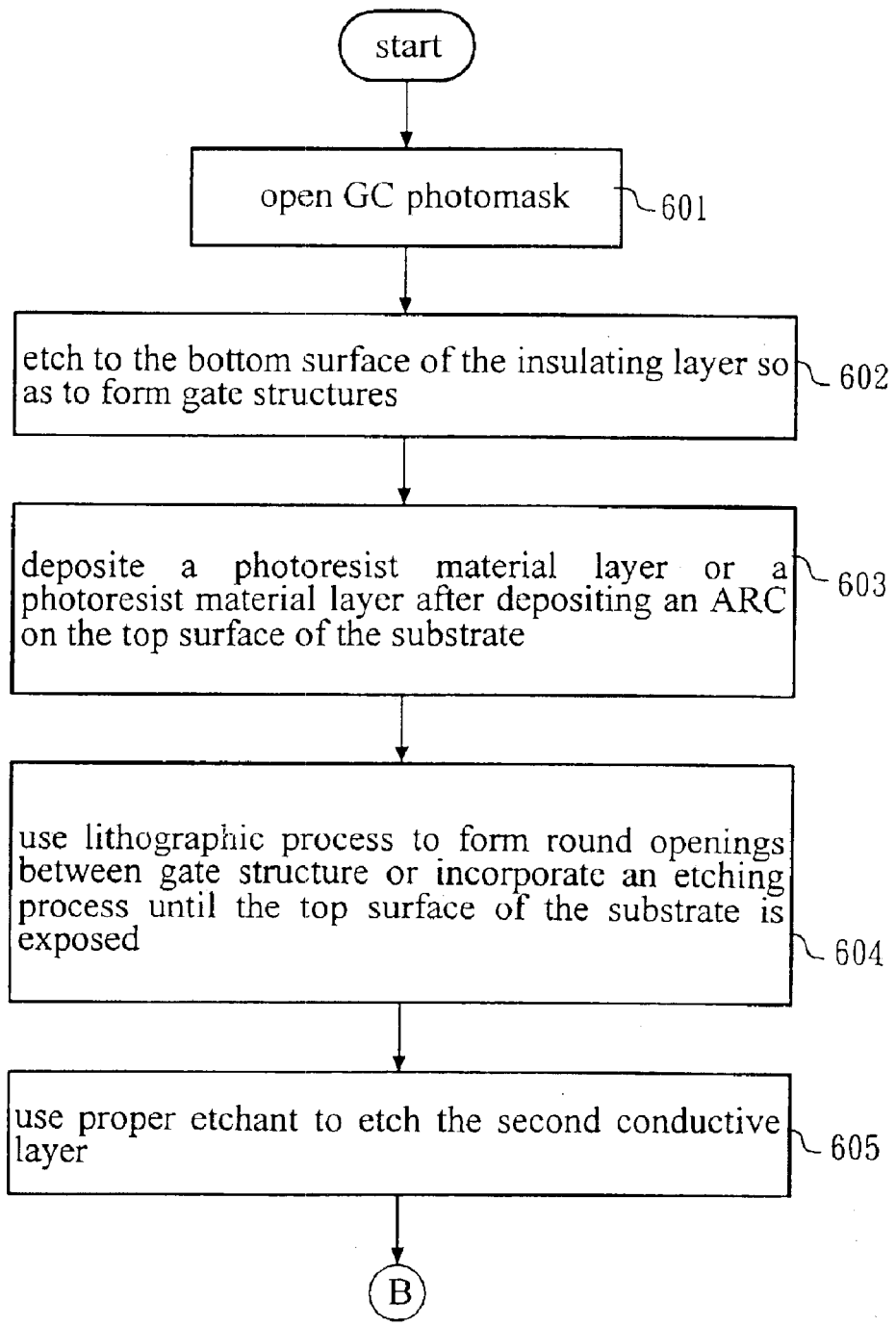
FIGS. 6A–6B represent a flow chart of the method of forming a self-aligned contact structure according to the second embodiment of the present invention.
Figure 6B:
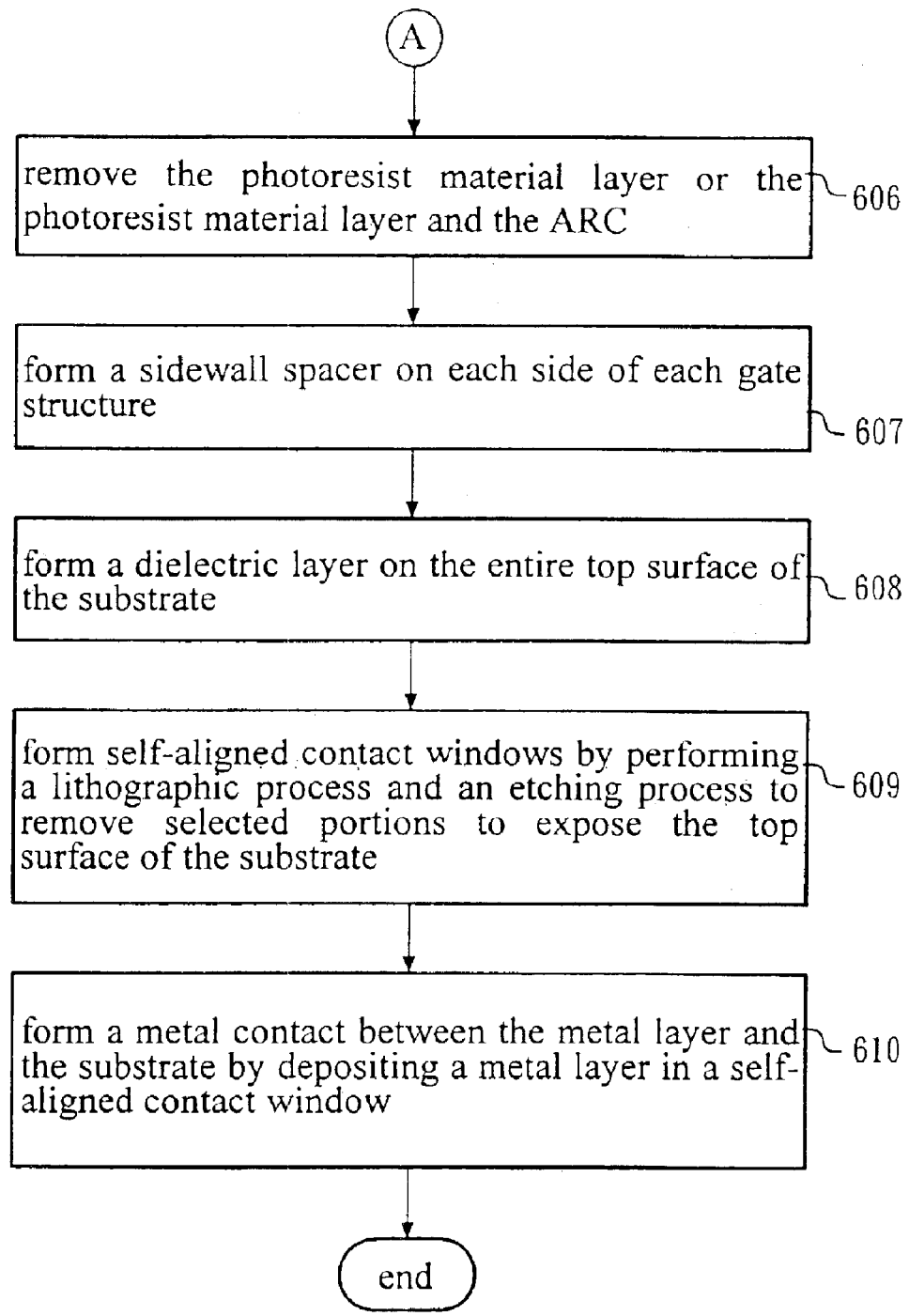

The second embodiment of the present invention is illustrated in the structures from FIGS. 5A–5F and the method shown in the flow chart of FIGS. 6A–6B.

First, a substrate 2 that has a first conductive layer 4, a second conductive layer 6, and an insulating layer 8 formed in sequence from bottom to top, is prepared. The first conductive layer 4 can be a polysilicon layer or an amorphous silicon layer, the second conductive layer 6 can be a metal silicide layer, such as a tungsten silicide (WSi) layer, and the insulating layer can be a silicon nitride layer. Next, as shown in FIG. 5A, the gate conductor (GC) photomask is opened (step 601). Next, a plurality of separated gate structures is formed by performing an etching process to the top surface of the substrate 2 (step 602).

Next, as shown in FIGS. 5A–6A, a photoresist material layer 22 is deposited, or an anti-reflective coating (ARC, not shown in the figures) and a photoresist material layer 22 are deposited, in turn, on the entire surface of the substrate 2 (step 603).

Next, as shown in FIGS. 5B and 6A, a bit-line contact photomask is used to form round openings between gate structures (step 604). The positions of the round openings are the regions of forming self-aligned contact later (please refer to FIG. 5G) and the etching process can be a dry etching process. Next, an etchant that has a higher etching rate to the second conductive layer 6 than to the insulating layer 8 and the first conductive layer 4, is used to etch the second conductive layer, which is not masked by the photoresist material layer 22 (step 605), wherein the etching step can be an isotropic etching step (such as a mixture of $NH_4OH$, $H_2O_2$, and $H_2O$).

Next, as shown in FIGS. 5C and 6B, the photoresist material layer 22 and the anti-reflective coating (if there is any) are removed (step 606).

Next, as shown in FIGS. 5D and 6B, a sidewall spacer 10 is formed on each side of each gate structure (step 607). The sidewall spacer 10 can be a silicon nitride layer.

Next, as shown in FIGS. 5E and 6B, a dielectric layer 12 is deposited to cover the entire top surface of the substrate (step 608). Next, a portion of the dielectric layer 12, which is used to form bit-line contact, is removed by performing a lithographic process and an etching process so as to expose the top surface of the substrate to form self-aligned contact (step 609).

Next, as shown in FIGS. 5F and 6B, a metal layer 14 of a specific thickness is deposited on the entire top surface of the substrate to cover the exposed surface of the dielectric layer 12, the sidewall spacer 10 of the self-aligned contact, and the substrate 2 so as to form a metal contact in the self-aligned contact between the metal layer 14 and the substrate 2 (step 610).

Figure 5G:
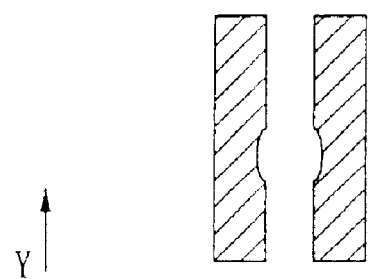
FIG. 5G is a top view of the second conductive layer of FIG. 5F.

FIG. 5G is a top view of the second conductive layer of FIG. 5F. The position of the round opening in step 604 can be seen in FIG. 5G.

The methods of the present invention differ from that of the U.S. Pat. No. 5,989,987, and the difference is that the present invention etches the side of the second conductive layer used to form the bit-line contact of each gate structure only and does not etch the other side of the second conductive layer not used to form the bit-line contact of each gate structure. Thus, the methods of the present invention can eliminate all of the disadvantages of the conventional method of forming a self-aligned contact structure and the method of U.S. Pat. No. 5,989,987. First, since the etching of the second conductive layer of step 406 of the first embodiment of the present invention and of step 605 of the second embodiment of the present invention generate a larger contact than the conventional method of forming a self-aligned contact structure, the contact between the second conductive layer 6 and the metal layer 14 at point 16 can be prevented. Secondly, since the etching of the second conductive layer 6 is only performed on the side of the gate structure used to form the bit-line contact and the side of the second conductive layer 6 of the gate structure not used to form the gate conductor/bit-line contact is not etched, the cross-section area of only one side of the second conductive layer 6 is reduced; thus the resistance of the gate structure is lower and the variation of the resistance of the gate structure is smaller. Lastly, since the reduction of the contact area between the second conductive layer 6 and the first conductive layer 4 is lessened, the chance of causing the peeling phenomenon in the subsequent processes is reduced.

With the above descriptions, it is obvious that the embodiments and description are not intended to limit the invention. The invention may be varied in many ways. Such variations are not to be regarded as a departure from the spirit and scope of the invention, and all such modifications would be obvious to one skilled in the art and fall within the scope of the following claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a gate structure with a locally etched conductive layer, comprising the steps of:

(a) preparing a semiconductor substrate, the substrate having a plurality of separated gate structures formed thereon, wherein each of the gate structures comprises a first conductive layer formed on the substrate, a second conductive layer formed on the first conductive layer and an insulating layer formed on the second conductive layer;

(b) using a photomask to form a covering layer that has at least an opening so as to expose parts of gate structures until the top surface of the substrate is exposed;

(c) using an etchant that has a higher etching rate to the second conductive layer than to the insulating layer and the first conductive layer to etch the second conductive layer of the exposed gate structures;

(d) removing the covering layer; and (e) forming a sidewall spacer on each side of each gate structure.

2. The method of forming a gate structure with a locally etched conductive layer of claim 1, wherein the step of forming the covering layer in step (b) comprises the steps of:

(i) depositing a photoresist material layer on the substrate; and (ii) performing a lithographic process.

3. The method of forming a gate structure with a locally etched conductive layer of claim 1, wherein the step of forming the covering layer in step (b) comprises the steps of:

(i) depositing an anti-reflective layer and a photoresist material layer on the substrate; and (ii) performing a lithographic process and an etching process.

4. The method of forming a gate structure with a locally etched conductive layer of claim 1, wherein the photomask of step (b) is a bit-line contact node photomask.

5. The method of forming a gate structure with a locally etched conductive layer of claim 1, wherein the photomask in step (b) is a bit-line contact photomask.

6. The method of forming a gate structure with a locally etched conductive layer of claim 1, wherein the first conductive layer is selected from the group consisting of polysilicon and amorphous silicon.

7. The method of forming a gate structure with a locally etched conductive layer of claim 1, wherein the second conductive layer is a metal silicide layer.

8. The method of forming a gate structure with a locally etched conductive layer of claim 1, wherein the etching process of step (c) is an isotropic etching process.

9. The method of forming a gate structure with a locally etched conductive layer of claim 1, wherein the etchant of step (c) is a mixture of $NH_4OH$, $H_2O_2$, and $H_2O$.

10. A method of forming a self-aligned contact with a locally etched conductive layer, comprising the steps of:

(a) preparing a semiconductor substrate, the substrate having a plurality of separated gate structures formed thereon, wherein each of the gate structures comprises a first conductive layer formed on the substrate, a second conductive layer formed on the first conductive layer, and an insulating layer formed on the second conductive layer;

(b) using a bit-line contact node photomask at the side of each gate structure used to form a bit-line contact to form a covering layer, which has at least an opening so as to expose parts of the gate structures until the top surface of the substrate is exposed;

(c) using an etchant that has a higher etching rate to the second conductive layer than to the insulating layer and the first conductive layer to etch the second conductive layer of the exposed side of each gate structure;

(d) removing the covering layer;

(e) forming a sidewall spacer on each side of each gate structure;

(f) forming a dielectric layer that covers the substrate;

(g) performing a lithographic process and an etching process to remove the dielectric layer of the side of each gate structure used to form the bit-line contact until the top surface of the substrate is exposed so as to from a self-aligned contact; and (h) forming a metal layer that covers the etched surface of the dielectric layer and the sidewall spacers of the gate structures and forming a self-aligned contact between the metal layer and the top surface of the exposed substrate.

11. The method of forming a self-aligned contact structure with a locally etched conductive layer of claim 10, wherein the step of forming the covering layer in step (b) comprises the steps of:

(i) depositing a photoresist material layer on the substrate; and (ii) performing a lithographic process.

12. The method of forming a self-aligned contact structure with a locally etched conductive layer of claim 10, wherein the step of forming the covering layer in step (b) comprises the steps of:

(i) depositing an anti-reflective layer and a photoresist material layer on the substrate; and (ii) performing a lithographic process and an etching process.

13. The method of forming a self-aligned contact structure with a locally etched conductive layer of claim 10, wherein the first conductive layer is selected from the group consisting of polysilicon and amorphous silicon.

14. The method of forming a self-aligned contact structure with a locally etched conductive layer of claim 10, wherein the second conductive layer is a metal silicide layer.

15. The method of forming a self-aligned contact structure with a locally etched conductive layer of claim 14, wherein the metal silicide layer is a tungsten silicide layer.

16. The method of forming a self-aligned contact structure with a locally etched conductive layer of claim 10, wherein the insulating layer is a silicon nitride layer.

17. The method of forming a self-aligned contact structure with a locally etched conductive layer of claim 10, wherein the sidewall spacer is a silicon nitride layer.

18. The method of forming a self-aligned contact structure with a locally etched conductive layer of claim 10, wherein the etching process of step (c) is an isotropic etching process.

19. The method of forming a self-aligned contact structure with a locally etched conductive layer of claim 10, wherein the etchant of step (c) is a mixture of $NH_4OH$, $H_2O_2$, and $H_2O$.

20. A method of forming a self-aligned contact window with a locally etched conductive layer, comprising the steps of:

(a) preparing a semiconductor substrate, the substrate having a plurality of separated gate structures formed thereon, wherein each of gate structures comprises a first conductive layer formed on the substrate, a second conductive layer formed on the first conductive layer, and an insulating layer formed on the second conductive layer;

(b) using a bit-line node photomask on the gate structures to form a covering layer that has at least a round opening so as to expose parts of the gate structures until the surface of the substrate is exposed, wherein the opening is the region used to form self-aligned contact windows;

(c) using an etchant that has a higher etching rate to the second conductive layer than to the insulating layer and the first conductive layer to etch the second conductive layer of the exposed side of each gate structure;

(d) removing the covering layer;

(e) forming a sidewall spacer at each side of each gate structure;

(f) forming a dielectric layer that covers the substrate;

(g) performing a lithographic process and an etching process to remove the dielectric layer of the side of each gate structure used to form the bit-line contact until the top surface of the substrate is exposed so as to from a self-aligned contact window; and (h) forming a metal layer that covers the etched surface of the dielectric layer and the sidewall spacers of the gate structures and forming a self-aligned contact between the metal layer and the top surface of the exposed substrate.

21. The method of forming a self-aligned contact structure with a locally etched conductive layer of claim 20, wherein the step of forming the covering layer in step (b) comprises the steps of:

(i) depositing a photoresist material layer on the substrate; and (ii) performing a lithographic process.

22. The method of forming a self-aligned contact structure with a locally etched conductive layer of claim 20, wherein the step of forming the covering layer in step (b) comprises the steps of:

(i) depositing an anti-reflective layer and a photoresist material layer on the substrate; and (ii) performing a lithographic process and an etching process.

23. The method of forming a self-aligned contact structure with a locally etched conductive layer of claim 20, wherein the first conductive layer is selected from the group consisting of polysilicon and amorphous silicon.

24. The method of forming a self-aligned contact structure with a locally etched conductive layer of claim 20, wherein the second conductive layer is a metal silicide layer.

25. The method of forming a self-aligned contact structure with a locally etched conductive layer of claim 24, wherein the metal silicide layer is a tungsten silicide layer.

26. The method of forming a self-aligned contact structure with a locally etched conductive layer of claim 20, wherein the insulating layer is a silicon nitride layer.

27. The method of forming a self-aligned contact structure with a locally etched conductive layer of claim 20, wherein the sidewall spacer is a silicon nitride layer.

28. The method of forming a self-aligned contact structure with a locally etched conductive layer of claim 20, wherein the etching process of step (c) is an isotropic etching process.

29. The method of forming a self-aligned contact structure with a locally etched conductive layer of claim 20, wherein the etchant of step (c) is a mixture of $NH_4OH$, $H_2O_2$, and $H_2O$.

* * * * *

UNITED STATES PATENT AND TRADEMARK OFFICE
CERTIFICATE OF CORRECTION

PATENT NO.    : 6,855,610 B2
DATED         : February 15, 2005
INVENTOR(S)   : M. S. Tung et al.

It is certified that error appears in the above-identified patent and that said Letters Patent is hereby corrected as shown below:

Title page,
Item [57], ABSTRACT,
Line 14, "to form self-aligned" should read -- to form a self-aligned --.

Column 7,
Line 59, "self-aligned contact with" should read -- self-aligned contact structure with --.

Signed and Sealed this

Twenty-third Day of August, 2005

JON W. DUDAS
*Director of the United States Patent and Trademark Office*